United States Patent
Toyoda

(10) Patent No.: US 7,211,873 B2
(45) Date of Patent: May 1, 2007

(54) SENSOR DEVICE HAVING THIN MEMBRANE AND METHOD OF MANUFACTURING THE SAME

(75) Inventor: Inao Toyoda, Anjo (JP)

(73) Assignee: Denso Corporation, Kariya (JP)

( * ) Notice: Subject to any disclaimer, the term of this patent is extended or adjusted under 35 U.S.C. 154(b) by 220 days.

(21) Appl. No.: 10/914,263

(22) Filed: Aug. 10, 2004

(65) Prior Publication Data

US 2005/0062121 A1    Mar. 24, 2005

(30) Foreign Application Priority Data

Sep. 24, 2003    (JP)    ............................. 2003-331732
Sep. 24, 2003    (JP)    ............................. 2003-331733

(51) Int. Cl.
      *H01L 29/84*    (2006.01)

(52) U.S. Cl. ................. 257/417; 73/861.42; 73/204.26

(58) Field of Classification Search ................. 257/417
See application file for complete search history.

(56) References Cited

U.S. PATENT DOCUMENTS

| | | | | |
|---|---|---|---|---|
| 3,748,571 A | * | 7/1973 | Kurtz ....................... 361/283.4 |
| 4,784,721 A | * | 11/1988 | Holmen et al. ................. 216/2 |
| 4,975,390 A | * | 12/1990 | Fujii et al. ..................... 438/53 |
| 5,056,362 A | * | 10/1991 | Ang et al. ............... 73/204.26 |
| 5,116,331 A | * | 5/1992 | Chapman ..................... 73/721 |
| 5,283,459 A | * | 2/1994 | Hirano et al. ................ 257/419 |
| 5,344,523 A | * | 9/1994 | Fung et al. .................... 438/53 |
| 5,589,810 A | * | 12/1996 | Fung ............................... 338/4 |
| 5,629,538 A | * | 5/1997 | Lipphardt et al. .......... 257/254 |
| 5,632,854 A | * | 5/1997 | Mirza et al. ................... 438/53 |
| 5,719,069 A | * | 2/1998 | Sparks ........................ 438/50 |
| 5,852,320 A | * | 12/1998 | Ichihashi ..................... 257/419 |
| 6,066,882 A | * | 5/2000 | Kato ........................... 257/414 |
| 6,150,681 A | * | 11/2000 | Allen .......................... 257/254 |
| 6,184,773 B1 | * | 2/2001 | Bonne et al. ................. 338/25 |
| 6,278,167 B1 | * | 8/2001 | Bever et al. ................ 257/415 |

(Continued)

FOREIGN PATENT DOCUMENTS

JP      A-10-185641      7/1998

(Continued)

OTHER PUBLICATIONS yourdictionary.com printout of the definition of both "membrane" and "diaphragm".*

*Primary Examiner*—David A. Zarneke
(74) *Attorney, Agent, or Firm*—Posz Law Group, PLC

(57) ABSTRACT

A sensor device for use in an automobile as an airflow sensor is composed of a silicon substrate in which a cavity is formed and a base plate bonded to the silicon substrate. An upper end of the cavity is closed with a thin membrane including a sensor element such as a temperature sensor element, while a lower end of the cavity is closed with the base plate. An air passage having a small cross-section is formed through the base plate, so that the cavity communicates with the outside air through the air passage. The thin membrane is prevented from being damaged by collision with foreign particles included in the airflow because the air in the cavity functions as a damper. The air passage may be made in the silicon substrate in parallel to its surface without using the base plate.

12 Claims, 6 Drawing Sheets

U.S. PATENT DOCUMENTS

| | | | |
|---|---|---|---|
| 6,365,055 B1 * | 4/2002 | Weber et al. | 216/2 |
| 6,388,279 B1 * | 5/2002 | Sakai et al. | 257/254 |
| 6,432,737 B1 * | 8/2002 | Webster | 438/53 |
| 6,441,503 B1 * | 8/2002 | Webster | 257/787 |
| 6,551,853 B2 * | 4/2003 | Toyoda | 438/90 |
| 6,649,988 B2 * | 11/2003 | Toyoda et al. | 257/417 |
| 6,681,623 B2 * | 1/2004 | Bonne et al. | 73/202 |
| 6,698,282 B2 * | 3/2004 | Yasukawa et al. | 73/204.26 |
| 6,762,672 B2 * | 7/2004 | Taguchi et al. | 338/25 |
| 6,789,430 B1 * | 9/2004 | Yoneda et al. | 73/754 |
| 6,848,320 B2 * | 2/2005 | Miyajima et al. | 73/763 |
| 6,870,086 B2 * | 3/2005 | Hamamoto et al. | 136/225 |
| 6,911,894 B2 * | 6/2005 | Bonne et al. | 338/25 |
| 7,095,064 B2 * | 8/2006 | Hamamoto | 257/254 |

FOREIGN PATENT DOCUMENTS

| | | |
|---|---|---|
| JP | A-10-221142 | 8/1998 |
| JP | A-2001-50787 | 2/2001 |
| JP | A-2001-194201 | 7/2001 |
| JP | A-2002-243517 | 8/2002 |
| JP | A-2003-130702 | 5/2003 |

* cited by examiner

US 7,211,873 B2

SENSOR DEVICE HAVING THIN MEMBRANE AND METHOD OF MANUFACTURING THE SAME

CROSS-REFERENCE TO RELATED APPLICATION

This application is based upon and claims benefit of priority of Japanese Patent Applications No. 2003-331732 filed on Sep. 24, 2003 and No. 2003-331733 filed on Sep. 24, 2003, the contents of which are incorporated herein by reference.

BACKGROUND OF THE INVENTION

1. Field of the Invention

The present invention relates to a sensor device having a thin membrane that includes a sensor element. The sensor device is advantageously used as an airflow sensor for detecting an amount of air supplied to an internal combustion engine.

2. Description of Related Art

An example of this kind of sensor device is disclosed in JP-A-2001-50787. In this sensor device, a cavity is formed in a semiconductor substrate, and a thin membrane made of an insulating film is positioned to face the cavity. This sensor device is used as an airflow sensor for detecting an amount of air supplied to an internal combustion engine. The amount of air is detected based on temperature changes sensed by a temperature sensor element included in the thin membrane. Small particles contained in an airflow hit, or collide with, the surface of the thin membrane, and thereby the thin membrane formed by an insulating film is often damaged. To increase the mechanical strength of the membrane against collision of foreign particles, edges of the membrane where the stress of collision concentrates are reinforced by polyimide resin.

In a process of manufacturing the conventional sensor device, however, an additional process for reinforcing the membrane edges with the polyimide resin is required. Further, the amount of polyimide resin reinforcing the membrane edges is decreased by abrasion with the foreign particles that repeatedly hit the membrane surface for a long time use because the polyimide resin is soft. The same problem is common to other sensors having the thin membrane, such as a gas sensor, a humidity sensor, or an infrared sensor.

SUMMARY OF THE INVENTIONS

The present invention has been made in view of the above-mentioned problem, and an object of the present invention is to provide an improved sensor device having a thin membrane which is properly prevented from being damaged by collision with foreign particles.

The sensor device used as an airflow sensor is composed of a silicon substrate in which a cavity is formed and a base plate bonded to the lower surface of the silicon substrate. A thin membrane including a temperature sensor element is formed on the upper surface of the silicon substrate. The upper opening of the cavity is closed with the thin membrane and the bottom opening of the cavity is closed with the base plate. In a base plate, an air passage through which the cavity communicates with the outside air is formed. The size of the air passage is made much smaller than the surface area of the thin membrane, so that a predetermined pressure loss occurs when air flows through the air passage.

An amount of airflow is detected based on an electric resistance of the temperature sensor element which varies according to the amount of airflow. When foreign particles in the airflow hit the thin membrane, the air in the cavity functions as a damper because the size of the air passage connected to the cavity is small and the air in the cavity cannot flow out quickly. On the other hand, the pressure in the cavity does not change according to temperature changes because the cavity communicates with the outside air. In other words, the thin membrane is prevented form being damaged by collision with the foreign particles and from being distorted by temperature changes.

The cavity may be made in a flat rectangular shape, and the air passage connected to the flat cavity may be made to extend in parallel to the upper surface of the silicon substrate. The thin membrane is positioned to face the cavity. In the process of manufacturing this type of sensor device, plural sensor devices are formed in a single wafer, and then the wafer is diced into individual sensor devices. That is, cavities and air passages are formed in the wafer, and then the thin membranes facing the respective cavities are formed. Then, the wafer is diced into individual sensor chips so that the air passage is open to the side surface of the individual sensor device.

Other objects and features of the present invention will become more readily apparent from a better understanding of the preferred embodiments described below with reference to the following drawings.

DETAILED DESCRIPTION OF THE PREFERRED EMBODIMENTS

Figure 1:
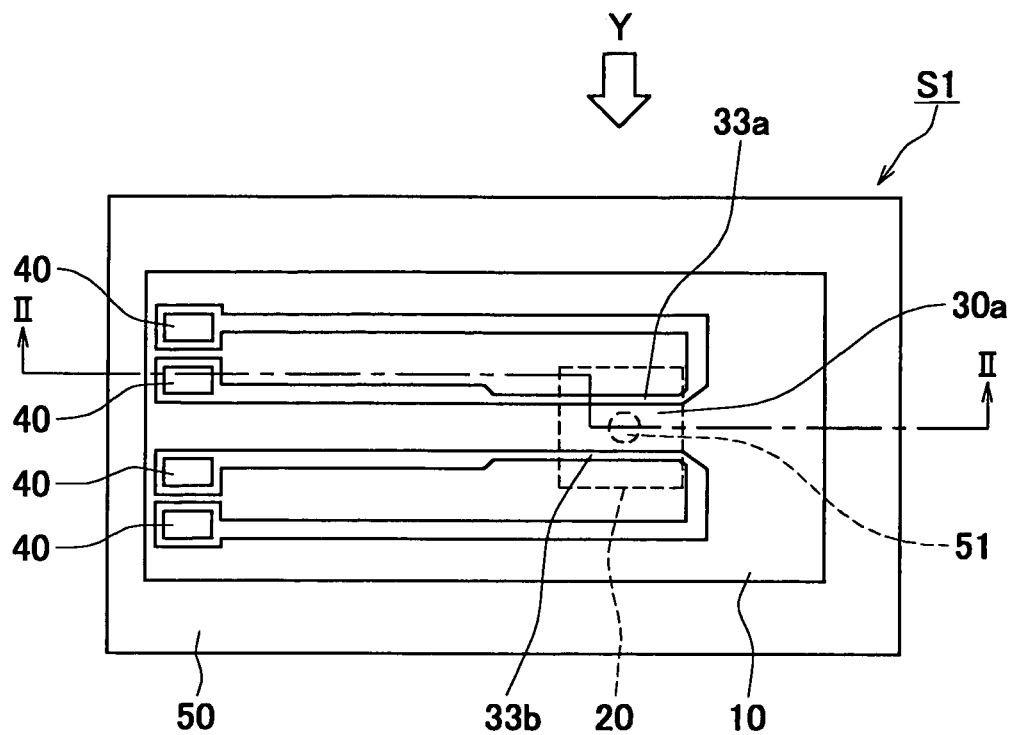
FIG. 1 is a plan view showing an airflow sensor according to the present invention, as a first embodiment.
Figure 2:
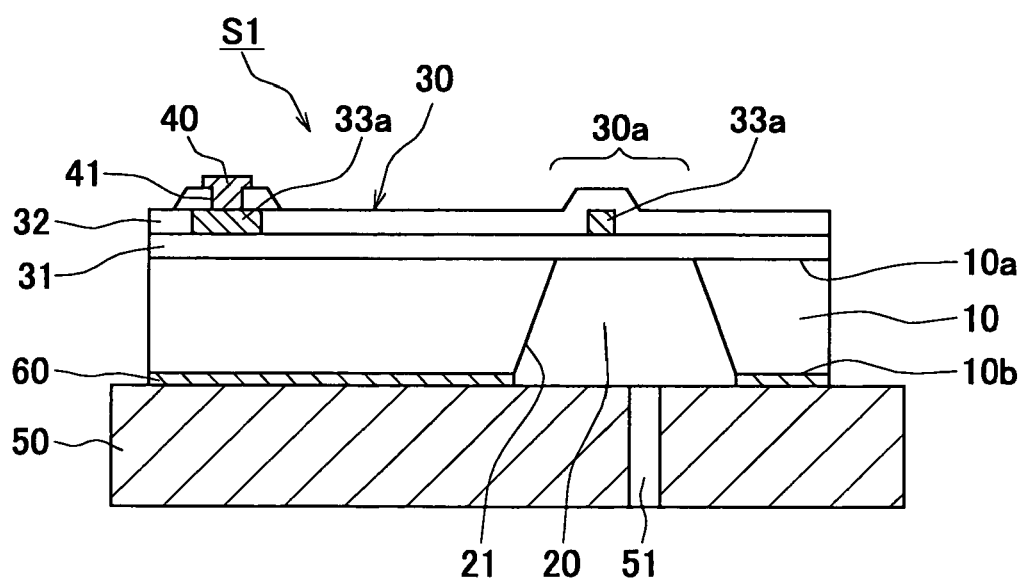
FIG. 2 is a cross-sectional view showing the airflow sensor shown in FIG. 1, taken along line II in FIG. 1.

A first embodiment of the present invention will be described with reference to FIGS. 1–3. FIGS. 1 and 2 show an airflow sensor S1 to which the present invention is applied. As better seen in FIG. 2, the airflow sensor S1 is composed of a silicon substrate 10 having a first surface 10a and a second surface 10b, laminated layers 30 formed on the first surface 10a and a base plate 50 bonded to the second surface 10b with an adhesive 60. A cavity 20 is formed in the silicon substrate 10 by anisotropic etching or the like. The cavity 20 has an opening 21 open to the second surface 10b of the silicon substrate 10, and its first surface side is closed with the laminated layers 30.

The laminated layers 30 include a first insulation layer 31 and a second insulation layer 32 laminated in this order on the first surface 10a of the silicon substrate 10. The laminated layers 30 also include thin film resistors 33a and 33b positioned on the cavity 20. Both insulation layers 31, 32 are formed to cover an entire area of the first surface 10a including the cavity 20, and the thin film resistors 33a, 33b are patterned so that at least portions thereof are positioned on the cavity 20, as shown in FIG. 1. Each of the insulation layers 31, 32 is composed of an insulation film or films made of silicon dioxide ($SiO_2$), silicon nitride (SiN) or the like. The insulation layers 31, 32 are formed by spattering or vapor deposition.

The thin film resistors 33a, 33b are made of platinum or poly-silicon by spattering, vapor deposition or the like. In this particular embodiment, the thin film resistor 33b functions as a temperature sensor, and the thin film resistor 33a is used as a heater for heating the thin film resistor 33b. That is, temperature changes are detected based on changes in the resistor of the thin film resistor 33b.

As shown in FIG. 1, portions of the thin film resistors 33a, 33b are positioned on the cavity 20, and other portions thereof extend to the side edge of the silicon substrate 10 where pads 40 for electrically connecting the thin film resistors 33a, 33b to an outside electronic control unit are formed. The pads 40 are made of aluminum and extend through a opening 41 to the thin film resistors 33a, 33b, so that the thin film resistors 33a, 33b are electrically connected to the pads 40. The pads 40 are electrically connected to the outside electronic control unit through bonding wires.

A part of the laminated layers 30 faces the cavity 20 and constitutes a thin membrane 30a. The membrane 30a facing the cavity 20 is made thin to enhance sensitivity of the airflow sensor S1. Generally, the sensitivity of a temperature sensor is enhanced by making a portion where a sensor element is located thin. The thin film resistor 33b functioning as the temperature sensor element is positioned in the thin membrane 30a.

The second surface 10b of the silicon substrate where the opening 21 of the cavity 20 is located is covered with a base plate 50. The base plate 50 is made of a material such as metal, resin or ceramics including glass, and bonded to the second surface 10b of the silicon substrate 10 with adhesive 60 made of resin or the like. As shown in FIG. 2, a through-hole 51 is formed in the base plate 50 so that the cavity 20 communicates with the outside. The size of the through-hole 51 (a cross-sectional area of the through-hole 51) is much smaller than the thin membrane 30a, so that a predetermined pressure loss occurs when air flows through the through-hole 51. The through-hole 51 may be formed by various methods such as machining or presswork.

Operation of the airflow sensor S1 described above will be briefly explained. As shown in FIG. 1, air flows in Y-direction and hits the airflow sensor S1. The thin film resistor 33b serving as the temperature sensor element is heated by the thin film resistor 33a, and accordingly the temperature of the thin film resistor 33b is higher than the temperature of the air flowing in Y-direction. The thin film resistor 33b is cooled by the airflow, and its resistance changes accordingly. The amount of air in the airflow is detected based on the changes in the resistance of the thin film resistor 33b. Both thin film resistors 33a, 33b may be used as the temperature sensor elements, and the amount of air may be detected based on a resistance difference between two thin film resistors 33a, 33b in a manner known in the conventional airflow sensors.

Referring to FIG. 2, a process of manufacturing the airflow sensor S1 will be briefly described. The silicon substrate 10 in which the cavity 20 is not formed is provided. The first insulation layer 31 is formed on the first surface 10a of the silicon substrate 10 by spattering or vapor deposition.

Then, a layer of the thin film resistors 33a, 33b made of platinum or poly-silicon are formed on the first insulation layer 31 by spattering or vapor deposition. This layer is patterned into the shape of the thin film resistors 33a, 33b by photolithography. Then, the second insulation layer 32 is formed on the first insulation layer 31 to cover the thin film resistors 33a, 33b. Thus, the laminated layers 30 are formed on the first surface 10a of the silicon substrate 10.

Then, openings 41 are formed in the second insulation layer 32 by dry etching or the like. The pads 40 are formed by spattering or the like by filling the openings 41 with aluminum so that aluminum reaches the thin film resistors 33a, 33b. Then, the cavity 20 is formed in the silicon substrate 10 by etching from the second surface 10b so that the cavity 20 reaches the laminated layers 30 at the first surface 10a. The cavity 20 may be formed by anisotropic etching, in a well known manner, using potassium hydroxide (KOH) or tetramethylammonium hydroxide (TMAH). Then, the base plate 50 in which the through-hole 51 is formed is bonded to the second surface 10b of the silicon substrate 10 with adhesive 60. Thus, the airflow sensor S1 is completed.

Advantages attained in the first embodiment described above are as follows. Though the cavity 20 is closed at one side with the laminated layers 30 (the thin membrane 30a) and at the other side with the base plate 50, it communicates with the outside through the through-hole 51. The size of the through-hole is made much smaller than the thin membrane 30a so that a predetermined pressure loss occurs when air flows through the through-hole 51.

Figure 3:
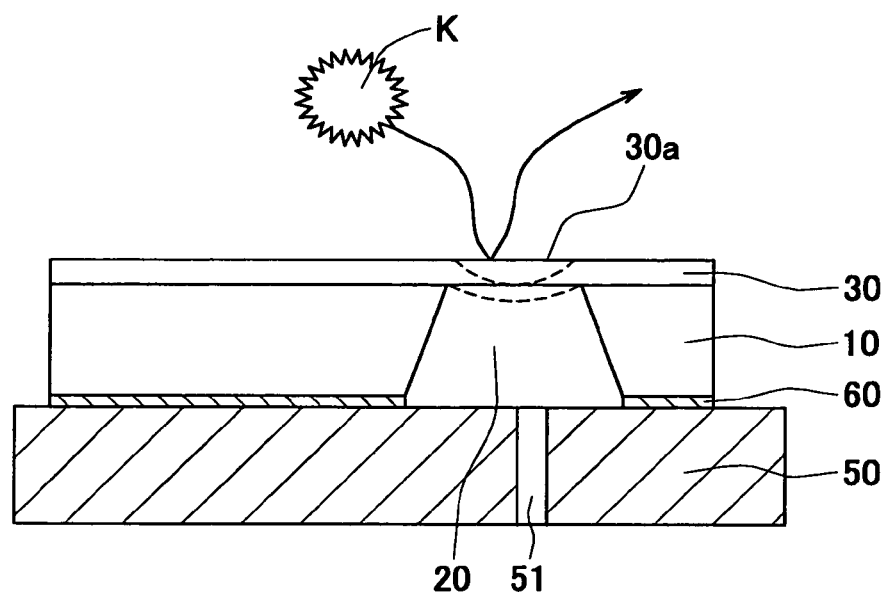
FIG. 3 is a drawing for explaining collision of a foreign particle with a thin membrane of the airflow sensor.

As shown in FIG. 3, when a foreign particle K hits the thin membrane 30a, the thin membrane 30a deforms toward the cavity 20 to thereby compress the air in the cavity 20. Since the size of the through-hole 51 is so small that a predetermined pressure loss occurs when the air flows through the through-hole 51, the air in the cavity 20 cannot freely expand. Therefore, the air in the cavity 20 functions as a damper. Accordingly, deformation of the thin membrane 30a caused by the collision with the foreign particle K is alleviated by the damper effect of the air in the cavity 20. Thus, the thin membrane 30a is prevented from being damaged by the collision with the foreign particles.

On the other hand, when the air in the cavity 20 expands according to a temperature rise, the air can expand to the outside through the through-hole 51. Therefore, the thin membrane 30a is not deformed or distorted by the temperature rise. When the air in the cavity 20 is heated by the thin film resistor 33a serving as a heater, the pressure in the cavity is maintained unchanged.

In other words, the air in the cavity 20 communicating with the outside through the small through-hole 51 functions as a damper against a rapid volume change in the cavity 20, while the pressure in the cavity 20 is maintained unchanged when the temperature in the cavity 20 slowly changes. In addition, deformation or distortion of the thin membrane 30a due to rapid pressure changes for some reasons is prevented or alleviated by the damper effect of the air in the cavity 20.

The size of the through-hole 51 has to be made sufficiently smaller than that of the thin membrane 30a to obtain a good damper effect. Both the length and the cross-section of the through-hole may be variously changed to obtain a desired amount of damper effect.

A second embodiment of the present invention will be described with reference to FIGS. 4, 5, 6 and 7A–7I. In this embodiment, a cavity 20a is formed in the laminated layers 30. Components of the second embodiment labeled with the same reference numbers as those of the first embodiment are the same or the similar components as those of the first embodiment. An airflow sensor S2 is composed of a silicon substrate 10 having a first surface 10a and a second surface 10b, and the laminated layers 30 formed on the first surface 10a. The laminated layers include a first insulation layer 31 made of silicon dioxide, a second insulation layer 32 made of silicon dioxide, thin film resistors 33a, 33b and a silicon nitride layer 34, those layers being laminated in this order on the first surface 10a of the silicon substrate 10.

Figure 4:
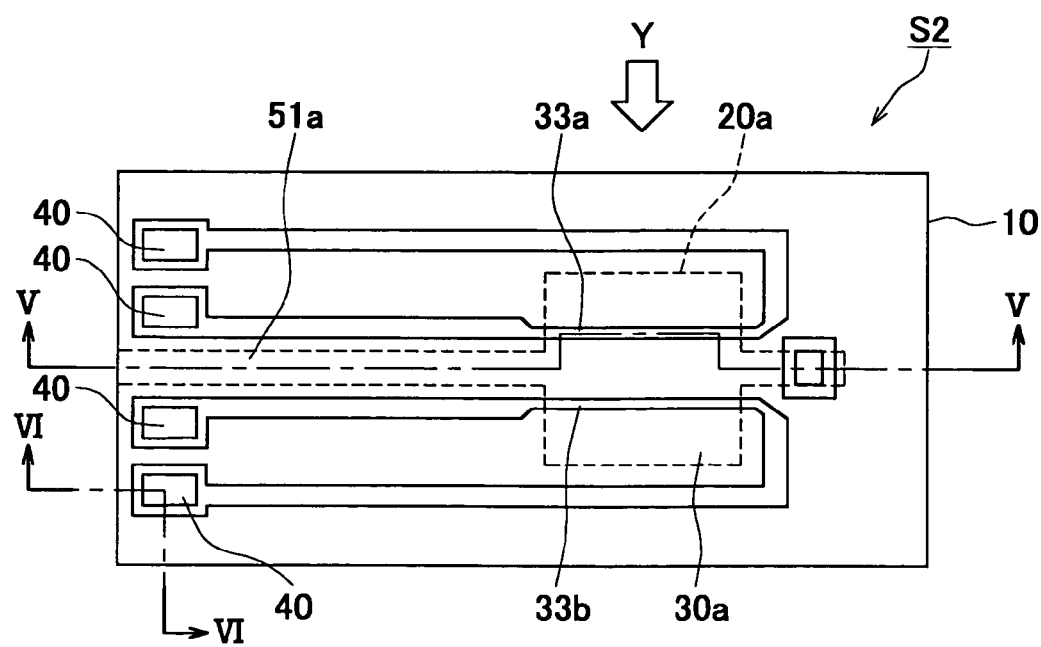
FIG. 4 is a plan view showing an airflow sensor according to the present invention, as a second embodiment.
Figure 5:
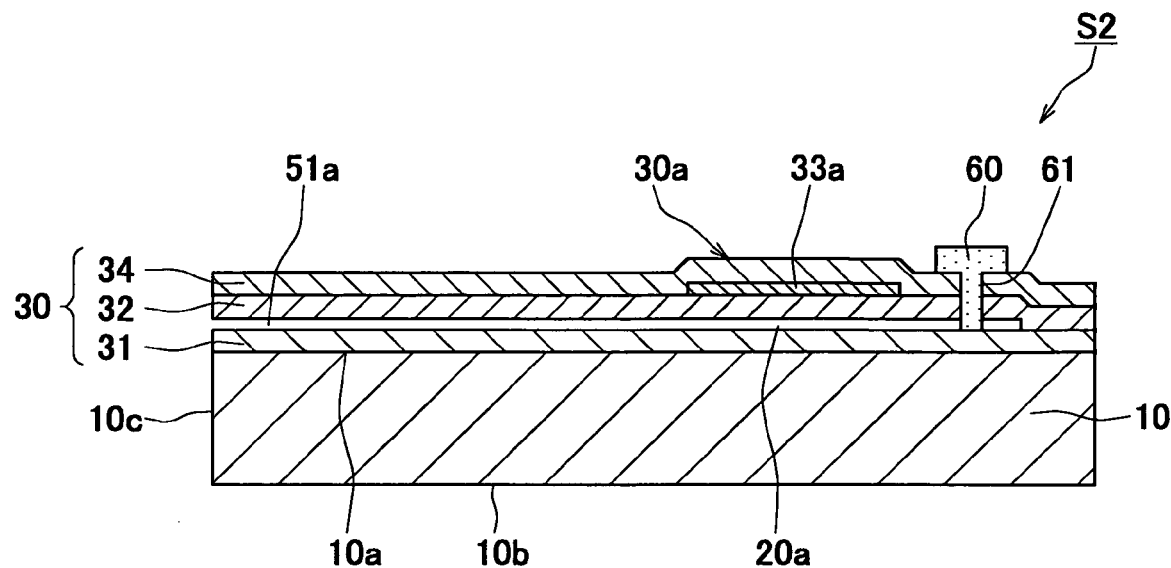
FIG. 5 is a cross-sectional view showing the airflow sensor shown in FIG. 4, taken along line V—V in FIG. 4.

The first and the second insulation layers 31, 32, and the silicon nitride layer 34 are formed by spattering or vapor deposition to cover the entire first surface 10a of the silicon substrate 10. The thin film resistors 33a, 33b made of platinum or poly-silicon are formed by spattering or vapor deposition and shaped by patterning to the shape as shown in FIG. 4. The cavity 20a is formed in the laminated layers 30 (between the first insulation layer 31 and the second insulation layer 32 in this particular embodiment). As shown in FIGS. 4 and 5, the cavity 20a is formed in a flat rectangular shape. A portion of the laminated layers 30 facing the cavity 20a constitute a thin membrane 30a. The membrane 30a is made thin to enhance sensitivity of the temperature sensor element 33b embedded in the membrane 30a.

An air passage 51a is also formed in the laminated layers 30, so that the cavity 20a communicates with the outside air. The air passage 51a opens to a side surface 10c of the silicon substrate 10, as shown in FIG. 5. The cross-sectional area of the air passage 51a is made much smaller than the plane area of the cavity 20a so that a predetermined pressure loss occurs when air flows through the air passage 51a.

Figure 6:
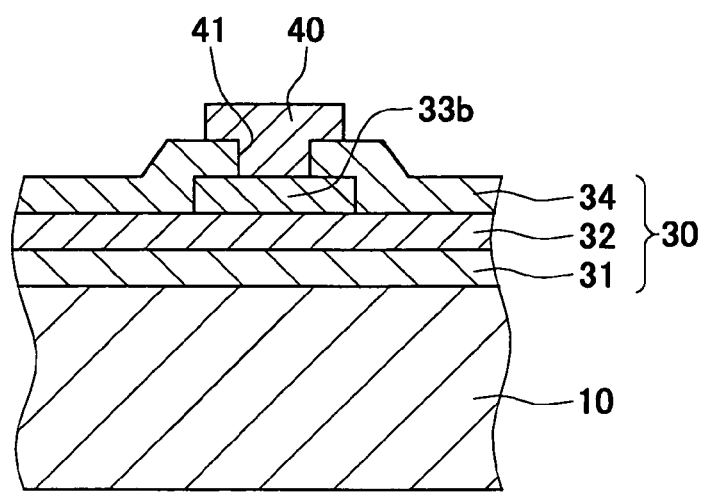
FIG. 6 is a cross-sectional view showing part of the airflow sensor shown in FIG. 4 in an enlarged scale, taken along line VI—VI in FIG. 4.

As shown in FIG. 4, the thin film resistor 33a serving as a heater and the thin film resistor 33b functioning as a temperature sensor element are patterned, so that portions thereof face the cavity 20a and other portions extend to pads 40 formed at one end portion of the laminated layers 30. As shown in FIG. 6, an opening 41 reaching the thin film resistor 33b is formed in the silicon nitride layers 34, and the opening 41 is filled with aluminum to form the pad 40. Thus, the thin film resistor 33b is electrically connected to the pad 40. Other pads 40 electrically connected to the thin film resistor 33a are formed in the same manner. A hole 61 connecting the cavity 20a to the surface of the silicon nitride layer 34 is formed, as better seen in FIG. 5, and the hole 61 is filled with closing film 60 made of silicon dioxide or the like. The hole 61 is used in a process (described later in detail) for removing a sacrificial layer to thereby form the cavity 20a.

The airflow sensor S2 described above as the second embodiment of the present invention operates in the same manner as the airflow sensor S1 of the first embodiment. That is, an amount of airflow flowing in Y-direction (FIG. 4) is detected based on the resistance changes in the thin film resistor 33b.

Figure 7A:
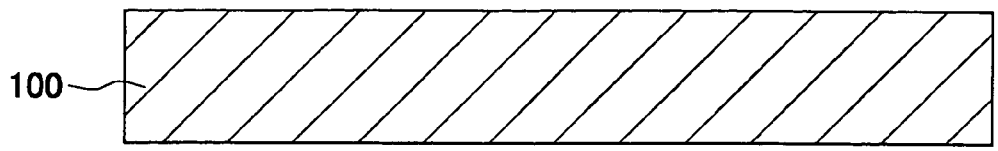
FIGS. 7A–7I are cross-sectional views showing a process of manufacturing the airflow sensor shown in FIG. 4.
Figure 7B:
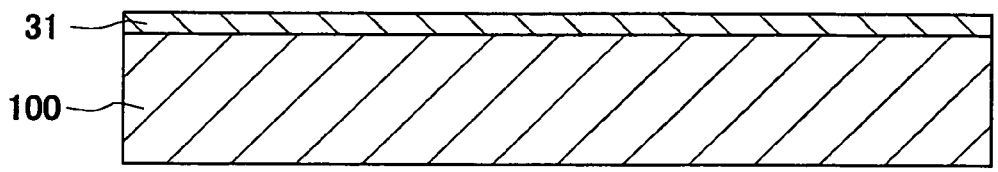
Figure 7C:
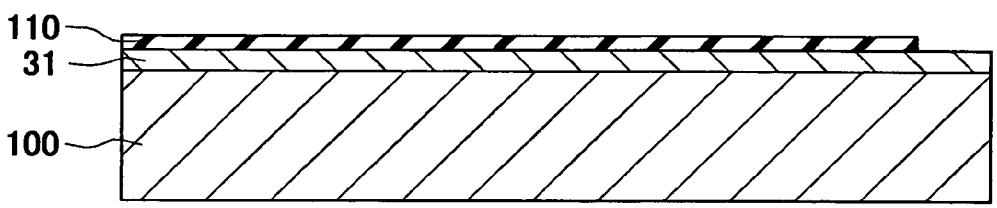

Now, a process of manufacturing the airflow sensor S2 will be described with reference to FIGS. 7A–7I showing cross-sectional views of the silicon substrate and the laminated layers in each step. First, a silicon wafer 100 shown in FIG. 7A is prepared. Then, a first insulation layer 31 made of silicon dioxide is formed on the silicon wafer 100 by spattering or vapor deposition as shown in FIG. 7B. Then, as shown in FIG. 7C, a sacrificial layer 110, which is to be removed in a later step to form the cavity 20a and the air passage 51a, is formed on the first insulation layer 31. To form the sacrificial layer 110, a poly-silicon layer covering the entire surface of the first insulation layer 31 is formed by chemical vapor deposition (CVD) or the like, and then the poly-silicon layer is patterned into a pattern corresponding to the cavity 20a and the air passage 51a.

Figure 7D:
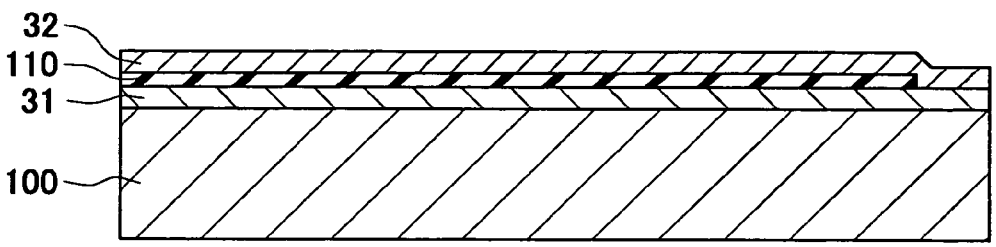
Figure 7E:
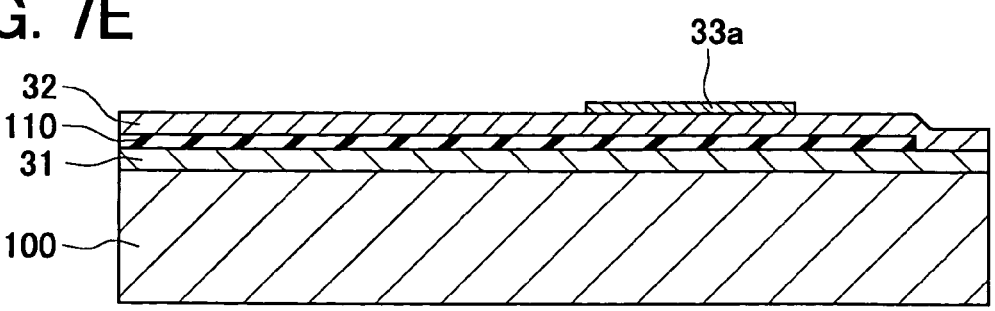
Figure 7F:
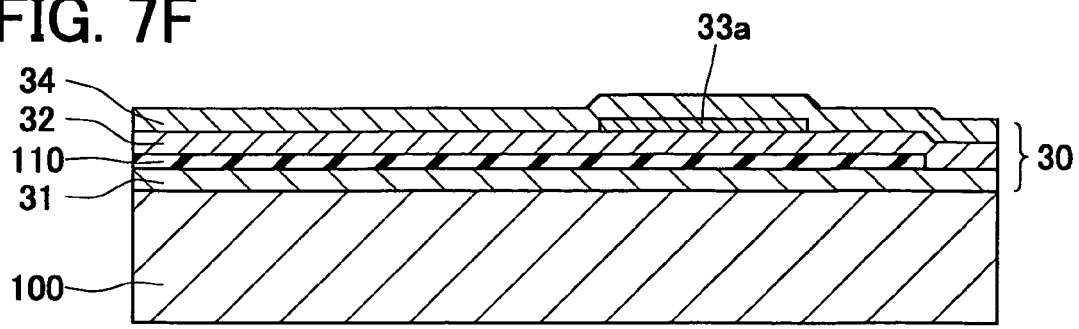

Then, as shown in FIG. 7D, the second insulation layer 32 made of silicon dioxide is formed on the first insulation layer 31 to cover the sacrificial layer 110. Then, as shown in FIG. 7E, the thin film resistors 33a, 33b are formed on the second insulation layer 32 in the following manner. First, a film made of platinum or poly-silicon is formed on the second insulation layer 32 by spattering or vapor deposition, and then the film is patterned into a desired shape by photolithography. Though only the thin film resistor 33a is shown in FIG. 7E, the thin film resistor 33b is formed in the same manner. Then, as shown in FIG. 7F, the silicon nitride film 34 is formed on the second insulation layer 32 to cover the thin film resistors 33a, 33b by spattering or vapor deposition. Thus, all the laminated layers 30 are formed on the silicon substrate 100.

Figure 7G:
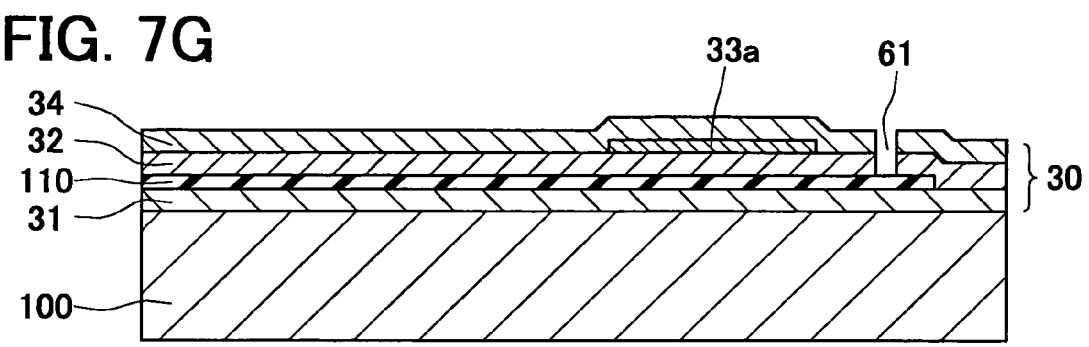
Figure 7H:
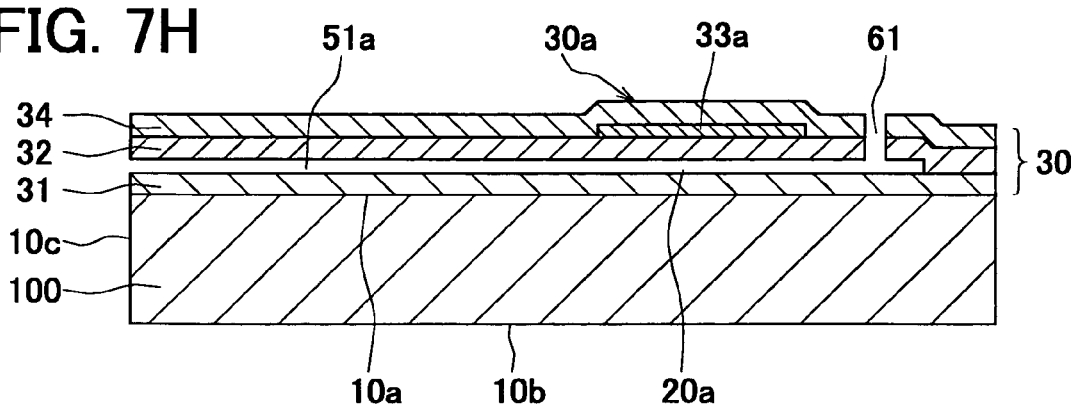

Then, pads 40 (not shown in drawings) made of aluminum for electrically connecting the thin film resistors 33a, 33b to the outside electronic control unit are formed on the silicon nitride layer 34. Then, as shown in FIG. 7G, the hole 61 extending from the surface of the silicon nitride layer 34 to the sacrificial layer 110 is formed by dry etching or the like. Then, as shown in FIG. 7H, the sacrificial layer 110 is removed by etching. Well known etching liquid such as tetramethylammonium hydroxide (TMAH) is supplied to the sacrificial layer 110 through the hole 61. The cavity 20a and the air passage 51a are formed at the same time by etching. The thin membrane 30a faces the cavity 20a when the cavity 20a is formed. At this stage, the air passage 51a is not open to the side surface 10c of the silicon substrate 10. The air passage 51a opens when an end portion of the silicon substrate 10 is cut off along a dicing line DL as shown in FIG. 7I.

Figure 7I:
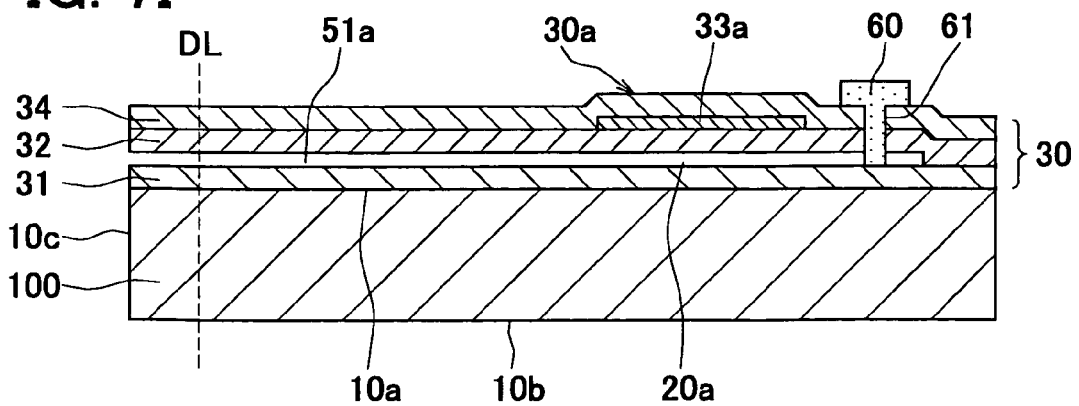

Then, as shown in FIG. 7I, the hole 61 is filled with the closing film made of silicon dioxide formed by CVD or the like, and its shape on the surface of the silicon nitride layer 34 is patterned into a desired shape. Thus, the process of forming plural sensor chips on the silicon wafer 100 is completed. Then, the silicon wafer 100 is cut into individual airflow sensors S2 along the dicing lines DL. In this dicing step, the air passage 51a is opened to the side surface 10c of the silicon substrate 10.

The same advantages as those in the first embodiment are obtained in this second embodiment, too, by forming the cavity 20a communicating with the outside air through the thin air passage 51a. That is, the pressure in the cavity 20a is maintained at a constant level when the air in the cavity 20a slowly expands according to a temperature rise, while a rapid pressure change in the cavity 20a, which occurs when foreign particles collide with the thin membrane 30a, is alleviated by the damper effect of the air in the cavity 20a. Thus, the thin membrane 30a is prevented form being damaged in a long time usage. The size of the air passage 51a is made sufficiently small compared with the plane area of the cavity 20a to obtain a good damper effect.

The airflow sensor S2 having the cavity 20a and the thin membrane 30a can be easily manufactured in the process described above. That is, the cavity 20a and the air passage 51a are simultaneously formed by removing the sacrificial layer 110 by etching. Further, the air passage 51a is exposed to the side surface of the silicon substrate at the same time when the wafer having plural sensor chips is diced into individual sensor chips. Though the thin membrane 30a facing the cavity 20a is formed on the first surface 10a of the silicon substrate 10 in the second embodiment, it is also possible to additionally form the same structure on the second surface 10b.

Figure 8:
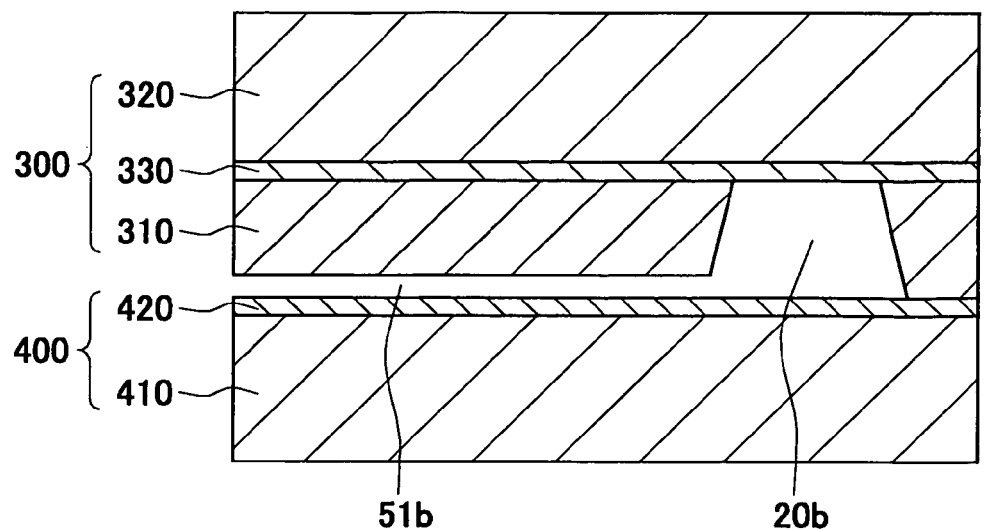
FIGS. 8 and 9 are cross-sectional views showing a process of manufacturing an airflow sensor as a third embodiment of the present invention.
Figure 9:
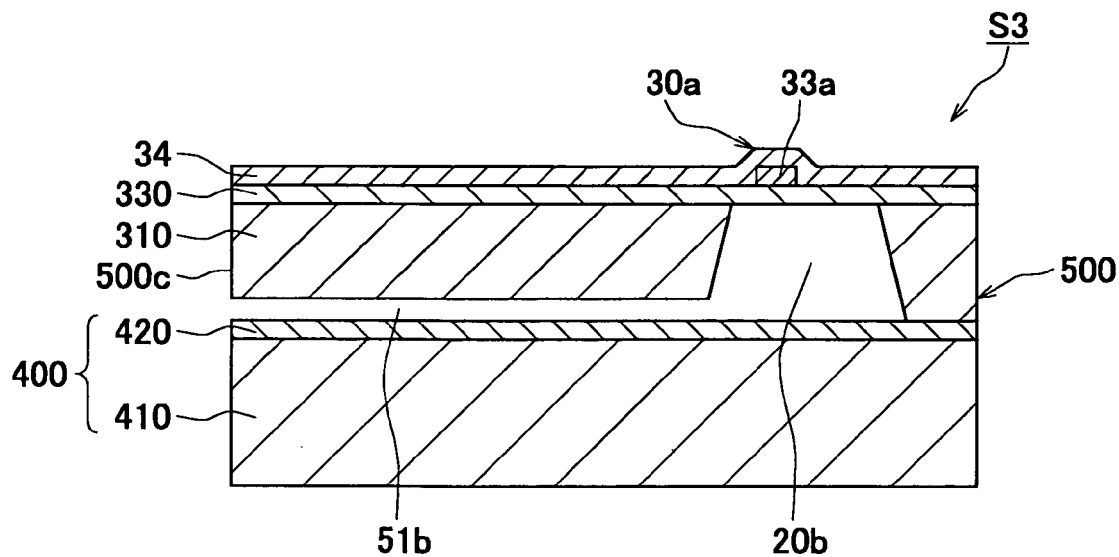

A third embodiment of the present invention will be described with reference to FIGS. 8 and 9. In FIG. 9, an airflow sensor S3 is shown as a third embodiment of the present invention, and in FIG. 8, a process of manufacturing the airflow sensor S3 is shown. As shown in FIG. 9, the airflow sensor S3 includes a first silicon layer 310 in which a cavity 20b is formed and a silicon substrate 400 bonded to the first silicon layer 310.

The airflow sensor S3 is manufactured in the following manner. As shown in FIG. 8, a silicon-on-insulator substrate (SOI) 300 composed of a first silicon layer 310, a silicon dioxide layer 330 and a second silicon layer 320, laminated in this order, is prepared. Then, a cavity 20b and an air passage 51b are formed by etching the first silicon layer 310. On the other hand, a silicon substrate 400 composed of a silicon layer 410 and a silicon dioxide layer 420 formed on the silicon layer 410 is prepared. The silicon substrate 400 and the SOI substrate 300 are bonded as shown in FIG. 8 by anodic bonding or the like. The cavity 20b and the air passage 51b are covered by the silicon substrate 400.

Then, as shown in FIG. 9, the second silicon layer 320 is removed by etching to expose the silicon dioxide layer 330 to the surface, and the thin film resistors 33a, 33b are formed on the silicon dioxide layer 330 in the same manner as in the foregoing embodiments. Then, a silicon nitride layer 34 is formed on the silicon dioxide layer 330, thereby covering the thin film resistors 33a, 33b. Pads 40 (not shown) for electrically connecting the thin film resistors 33a, 33b to the outside electronic control unit are formed in the same manner as in the foregoing embodiments. Thus, a bonded substrate 500, in which plural sensor chips are formed, is completed. Then, the wafer 500 is cut into individual airflow sensors S3 by dicing. In this dicing process, the air passage 51b is made open to the side surface 500c of the bonded substrate 500.

The airflow sensor S3 includes the cavity 20b formed in the first silicon layer 310 and the thin air passage 51b connecting the cavity 20b to the outside air. The size of the air passage 51b is made much smaller than the cavity 20b as done in the foregoing embodiments. When air flows through the air passage 51b, a predetermined pressure loss occurs therein. The advantages obtained in this third embodiment are the same as those in the foregoing embodiments. That is, the pressure in the cavity 20b is kept constant if the temperature changes, and a rapid pressure change in the cavity 20b caused by collision of foreign particles with the thin membrane 30a is alleviated by damper effect of the cavity 20b.

The present invention is not limited to the embodiments described above, but it may be variously modified. For example, this invention is applicable to various sensors having a thin membrane, on which a sensing element is formed, other than the airflow sensor. The sensors to which the present invention is applicable include a gas sensor having a sensing element responsive to a gas flow, a humidity sensor having a sensing element responsive to humidity, and an infrared sensor including a sensing element responsive to an amount of infrared beam.

While the present invention has been shown and described with reference to the foregoing preferred embodiments, it will be apparent to those skilled in the art that changes in form and detail may be made therein without departing from the scope of the invention as defined in the appended claims.

What is claimed is:

1. An airflow sensor device for measuring changes in airflow, comprising:
   a substrate;
   a cavity formed in the substrate;
   a thin membrane facing the cavity, the thin membrane including a sensor element and;
   an air passage through which the cavity communicates with an outside space of the substrate, wherein a predetermined amount of pressure loss occurs when air flows from the cavity through the air passage.

2. The sensor device as in claim 1, wherein:
   the substrate has a first surface on which the thin membrane is formed to face the cavity and a second surface to which the cavity is open; and
   the second surface to which the cavity is open is closed by a base plate in which a through-hole constituting the air passage is formed.

3. The sensor device as in claim 2, wherein:
   a cross-sectional area of the through-hole is smaller than an area of the thin membrane.

4. The sensor device as in claim 2, wherein:
   the substrate is a semiconductor substrate, and the base plate is made of a material selected from a group consisting of metal, resin and ceramics.

5. The sensor device as in claim 2, wherein:
   the substrate and the base plate are bonded to each other with adhesive.

6. The sensor device as in claim 1, wherein:
   the substrate has a first surface on which the thin membrane is formed to face the cavity and a second surface opposite to the first surface; and
   the air passage extends in parallel to the first surface and opens to a side surface of the substrate.

7. The sensor device as in claim 6, wherein:
   the cross-sectional area of the air passage is smaller than a area of the thin membrane.

8. A method of manufacturing the sensor device defined in claim 6, the method comprising:
   forming a plurality of the cavities in a wafer, each cavity corresponding to each sensor device;
   forming a plurality of the air passages, each air passage communicating with each cavity;
   forming a plurality of the membranes, each membrane facing each cavity; and
   cutting the wafer into individual sensor devices so that each air passage becomes open to a side surface of each substrate.

9. The method of manufacturing the sensor device as in claim 8, wherein:
   the cavities and the air passages are formed at the same time.

10. The airflow sensor device of claim 1, wherein the air passage has at least one of a length and a cross-sectional area that enables the predetermined amount of pressure loss to occur when air flows through the air passage to thereby protect the membrane from damage due to particles in the airflow being measured.

11. A sensor device, comprising:
    a substrate;
    a cavity formed in the substrate;
    a thin membrane facing the cavity, the thin membrane including a sensor element and;
    an air passage through which the cavity communicates with an outside space of the substrate, wherein a predetermined amount of pressure loss occurs when air flows from the cavity through the air passage, wherein the sensor device comprises one of an airflow sensor, a gas sensor, a humidity sensor and an infrared sensor.

12. The sensor device of claim 11, wherein the air passage has at least one of a length and a cross-sectional area that enables the predetermined amount of pressure loss to occur when air flows from the cavity through the air passage to thereby protect the membrane.

* * * * *